United States Patent [19]

Jung

[11] Patent Number: 5,674,759
[45] Date of Patent: Oct. 7, 1997

[54] METHOD FOR MANUFACTURING SEMICONDUCTOR DEVICE FOR ENHANCING HYDROGENATION EFFECT

[75] Inventor: Byung-Hoo Jung, Seoul, Rep. of Korea

[73] Assignee: Samsung Electronics Co., Ltd., Suwon, Rep. of Korea

[21] Appl. No.: 653,087

[22] Filed: May 24, 1996

Related U.S. Application Data

[63] Continuation of Ser. No. 364,390, Dec. 27, 1994, abandoned.

[30] Foreign Application Priority Data

Dec. 28, 1993 [KR] Rep. of Korea ............... 93-30229

[51] Int. Cl.⁶ .................. H01L 21/336; H01L 21/84; H01L 29/786
[52] U.S. Cl. .................. 437/21; 437/40 TFT; 437/41 TFT
[58] Field of Search .................. 437/21, 40 TFT, 437/41 TFT, 160, 161, 980, 24, 937

[56] References Cited

U.S. PATENT DOCUMENTS

| | | | |
|---|---|---|---|
| 4,883,766 | 11/1989 | Ishida et al. | 437/40 TFT |
| 4,907,052 | 3/1990 | Takada et al. | 257/458 |
| 5,065,222 | 11/1991 | Ishii | 257/639 |
| 5,250,444 | 10/1993 | Khan et al. | 437/24 |
| 5,401,685 | 3/1995 | Ha | 437/160 |
| 5,414,278 | 5/1995 | Kobayashi et al. | 257/72 |
| 5,483,096 | 1/1996 | Kuhara | 257/462 |

FOREIGN PATENT DOCUMENTS

| | | | |
|---|---|---|---|
| 3-248434 | 11/1991 | Japan | 437/40 TFT |
| 3-280435 | 12/1991 | Japan | 437/40 TFT |
| 5-62970 | 3/1993 | Japan | 437/980 |
| 6-97195 | 4/1994 | Japan | 437/40 TFT |

OTHER PUBLICATIONS

Matsumura et al., "Study on Impurity Diffusion in Glow-Discharged Amorphous Silicon", Jap. J. Appl. Phys., vol. 22, No. 5, May 1983, pp. 771–774.

Primary Examiner—Mary Wilczewski

[57] ABSTRACT

A method of manufacturing a semiconductor device having enhanced hydrogenation effect using a refractory metal capping layer formed over a plasma nitride layer, whereby hydrogen from the plasma nitride layer is diffused into a semiconductor transistor structure under heat treatment.

3 Claims, 4 Drawing Sheets

METHOD FOR MANUFACTURING SEMICONDUCTOR DEVICE FOR ENHANCING HYDROGENATION EFFECT

This is a continuation of application Ser. No. 08/364,390, filed on Dec. 27, 1994, which was abandoned upon the filing hereof.

BACKGROUND OF THE INVENTION

The present invention relates to a hydrogenation method for a semiconductor device, and more particularly, to a method for manufacturing a semiconductor device using an improved hydrogenation process to enhance characteristics of transistors, for example, a silicon-on-insulator devices, thin-film transistors (TFT) and metal-oxide semiconductor field-effect transistors (MOSFET).

Hydrogenation methods include r.f. plasma hydrogenation, electron cyclotron resonance hydrogenation, thermal hydrogenation, and plasma nitride hydrogenation.

FIG. 1 and FIG. 3 are section views showing a TFT hydrogenation process and a MOSFET hydrogenation process using a conventional plasma nitride.

The transistor shown in FIG. 1 is structured as follows.

An oxide layer 2 for use in a buffer is deposited on a substrate 1, and an active layer 5 is deposited on oxide layer 2. At both ends of active layer 5, dopants are injected. Thus, a source 3 and a drain 4 which are electrically channeled, are respectively formed. In addition, a gate 7 electrically insulated with the channel by means of an interposing insulating layer 6 is formed over the channel. An insulating layer 10 for inter-layer insulating is formed at both ends of gate 7, and a source electrode 8 and a drain electrode 9 are formed between gate 7 and insulating layer 10.

The transistor of FIG. 3 is structured as above. Here, reference numeral 21 is a substrate, 22 is a source, 23 is a drain, 24 is an oxide ($SiO_2$) layer, 25 is a gate, 26 is a source electrode, 27 is a drain electrode, 28 is an insulating layer, and 29 is a plasma nitride layer.

A method of hydrogenating the structures shown in FIG. 1 and FIG. 3 comprises the steps of forming layers in each device, forming a plasma nitride layer 11, 29 thereon, and performing a heat treatment whereby hydrogen is diffused into each lower transistor layer from the plasma nitride layer.

The above-mentioned hydrogenation process for diffusing a hydrogen into various kinds of transistor, results in the following effects. First, turn-on current (forward gate voltage) is increased, and turn-off current (reverse gate voltage) is decreased. Also, a sub-threshold slope is increased, and carrier movement is increased.

Despite such effects from the hydrogenation processing 20 using a conventional plasma nitride, a large quantity of hydrogen is out-diffused into the atmosphere as shown in FIG. 1 and FIG. 3. Thus, the desired hydrogenation effect is not achieved with. In addition, the out-diffusing reduces the time period over which the best diffusion effect is obtaining, thereby reducing process stability.

SUMMARY OF THE INVENTION

Accordingly, it is an object of the present invention to provide a method for manufacturing a transistor having enhanced a hydrogenation effect reducing the amount of hydrogen diffused out during heat treatment when the hydrogenation process is performed.

To accomplish the above object, there is provided a method for manufacturing a semiconductor device having enhanced hydrogenation effect comprising the steps of: (a) forming a source and drain on a substrate, an active layer for electrical conduction between the source and drain, an insulating layer for electrically insulating the active layer, a gate on the insulating layer, an insulating layer for the insulation of each transistor element, and electrodes respectively on the source, drain and gate; (b) forming a plasma nitride layer on the layers formed by the step (a); (c) forming a capping layer on the plasma nitride layer formed by the step (b); and (d) heat treating where a hydrogen generated from the plasma nitride layer formed by the step (b) is diffused into the transistor having a capping layer formed by the step (c).

In the present invention, it is desirable to form the capping layer of a material having a low hydrogen diffusion coefficient, or of a refractory metal.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE INVENTION

The present invention will be explained in more detail with reference to the attached drawings.

Figure 1:
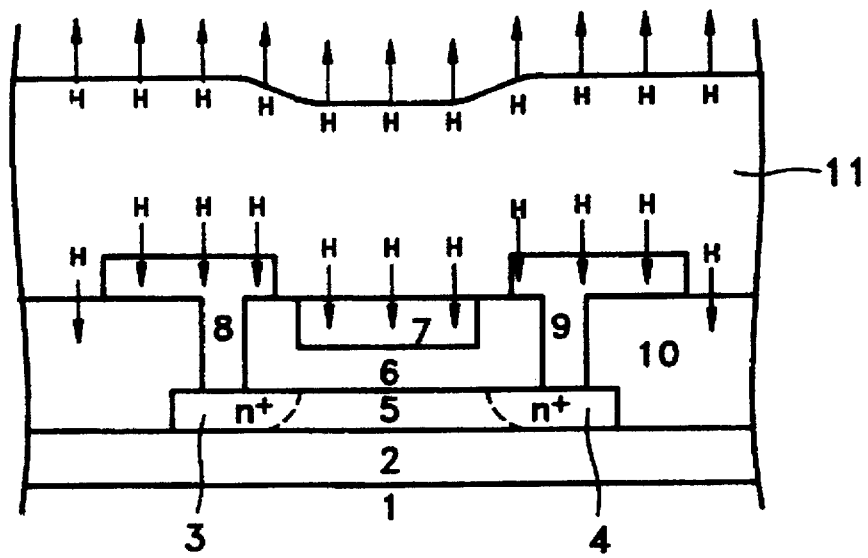
FIG. 1 is a section view showing a heat treatment process of a hydrogenation in a conventional TFT.
Figure 2:
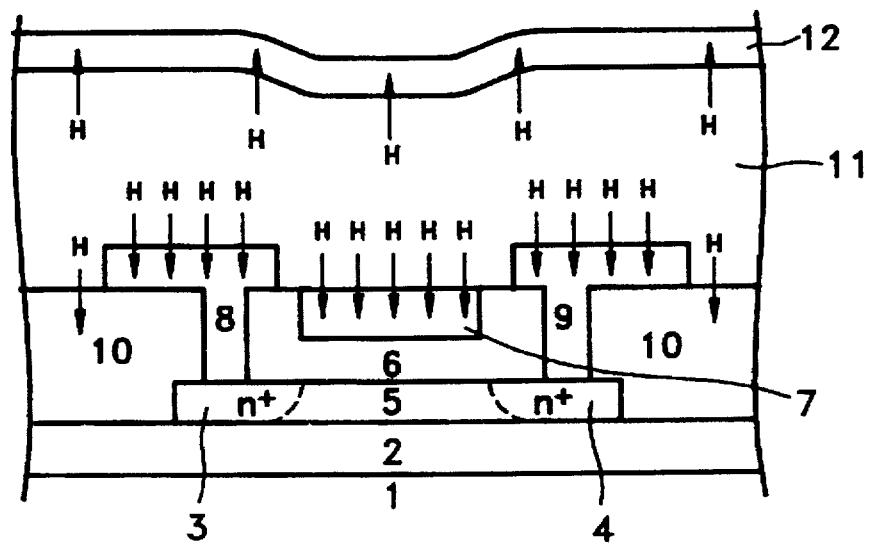
FIG. 2 is a section view showing a heat treatment process of a hydrogenation in a TFT of the present invention.
Figure 4:
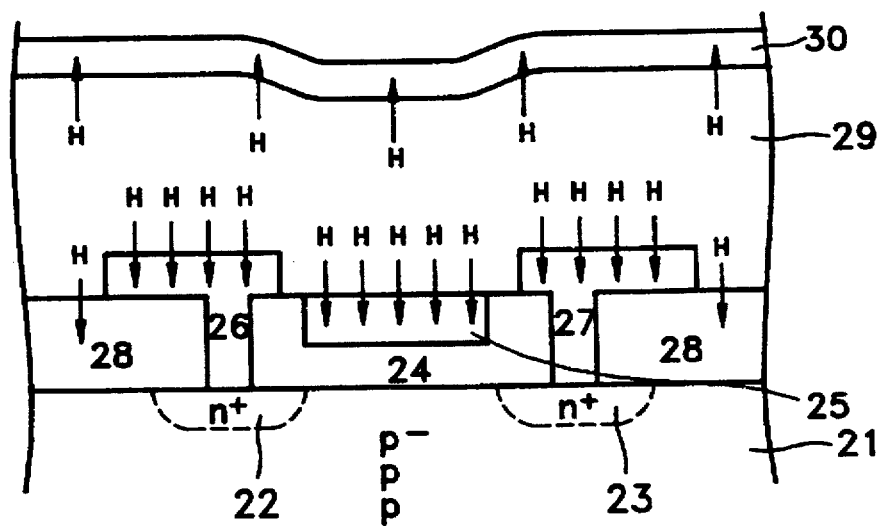
FIG. 4 is a section view showing a heat treatment process of a hydrogenation in a MOSFET of the present invention.

FIG. 2 illustrates embodiment 1, showing a method for manufacturing a semiconductor device having increased hydrogenation effect in a TFT. Meanwhile, FIG. 4 illustrates embodiment 2, showing a method for manufacturing a semiconductor device having increased a hydrogenation effect in a MOSFET. The hydrogenation enhancement method of the present invention will be described in connection with FIG. 2.

Firstly, an oxide buffer layer 2 is formed on a glass or crystal substrate 1, and a source 3 and a drain 4 are formed. Then, an active layer 5 for forming a conduction channel between source 3 and drain 4 is formed. An insulating layer 6 for electrically insulating active layer 5 is formed. Next, a gate 7 is formed on insulating layer 6, and an insulating layer 10 for insulating among each device of a transistor is formed. Thereafter, a source electrode 8 and a drain electrode 9 are formed. Thus, a fundamental structure for the transistor is formed.

Secondly, a plasma nitride layer 11 is formed on the layers formed as above.

Thirdly, a capping layer 12 is formed on plasma nitride layer 11.

Fourthly, hydrogen is generated from plasma nitride layer 11, and a heat treatment is performed so that the generated hydrogen can be diffused into the fundamental structure of the transistor. Thus, a process for manufacturing a transistor having increased hydrogenation effect according to the present invention is completed.

Figure 3:
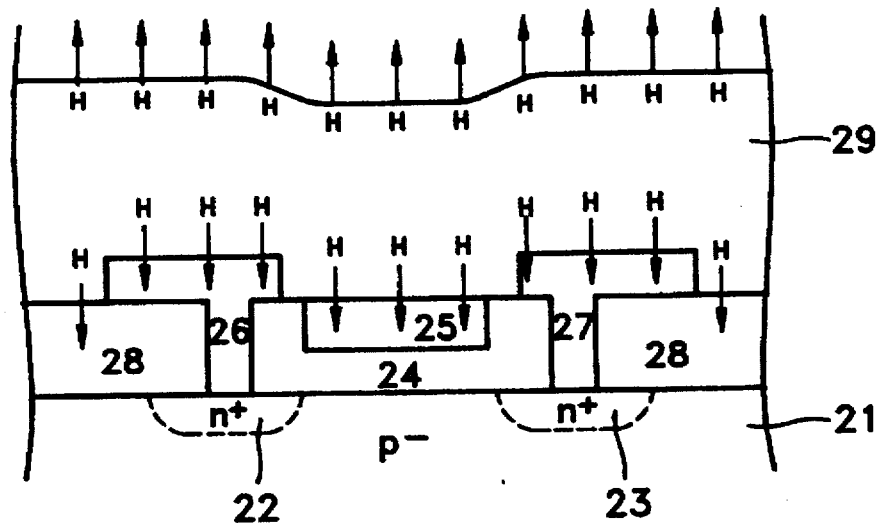
FIG. 3 is a section view showing a heat treatment process of a hydrogenation in a conventional MOSFET.

The hydrogenation method for the MOSFET of FIG. 4 is the same as that of FIG. 2, and the MOSFET itself has the same structure of FIG. 3. Reference numeral 30 denotes a capping layer.

As described above, capping layer is formed and a heat treatment for hydrogen diffusion is performed. Thus, a hydrogen generated from a plasma nitride (e.g., a-SiN$_x$:H) is diffused into an interior instead of being diffused out, thereby increasing the hydrogenation effect.

In addition, the capping layer is formed by a material (plasma silicon or a refractory metal) having a low hydrogen diffusion coefficient, in order to further reduce an amount of the diffused-out hydrogen. Thus, an amount of in-diffusion of the hydrogen is increased and a high density gradient is maintained for a long time, thereby increasing process simplicity and producibility.

Specifically, when the capping layer is formed by a plasma amorphous silicon (a-Si:H) having a low hydrogen diffusion coefficient, many dangling bonds are produced. The dangling bonds can serve as an effective barrier for the out-diffusion of hydrogen, and as a source for generating hydrogen. In addition, a plasma silicon layer can be deposited by in-situ growth onto a plasma nitride, thereby simplifying manufacturing process. Further, a refractory metal having a low hydrogen diffusion coefficient can be used.

Figure 5:
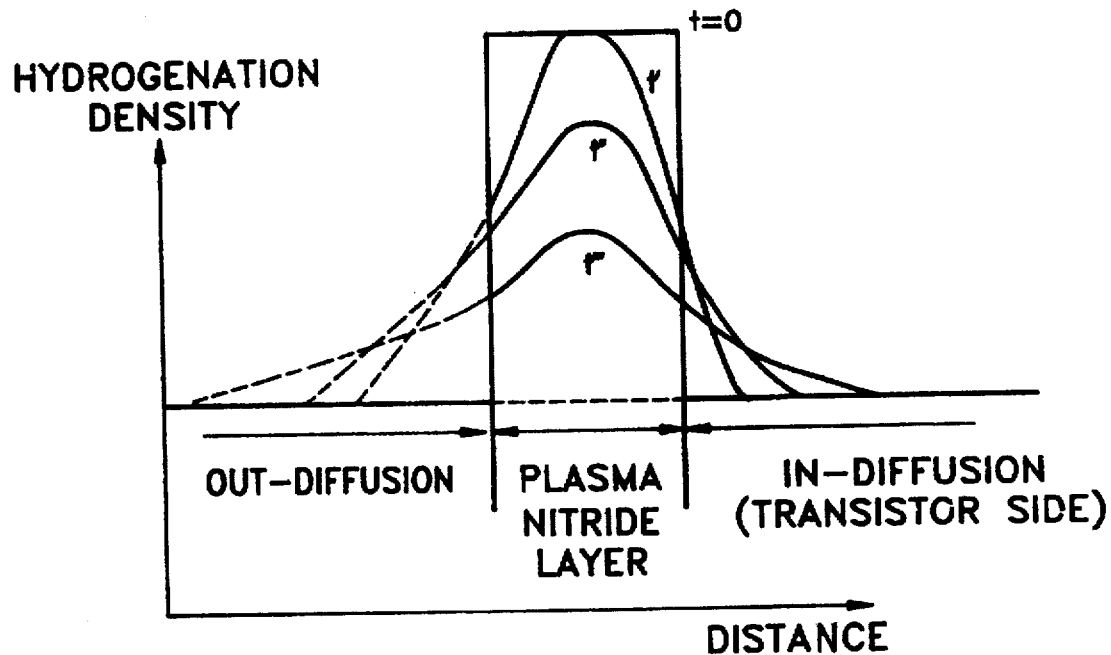
FIG. 5 is a graphical representation illustrating a hydrogen density distribution according to process time, in a conventional hydrogenation method using a plasma nitride.
Figure 6:
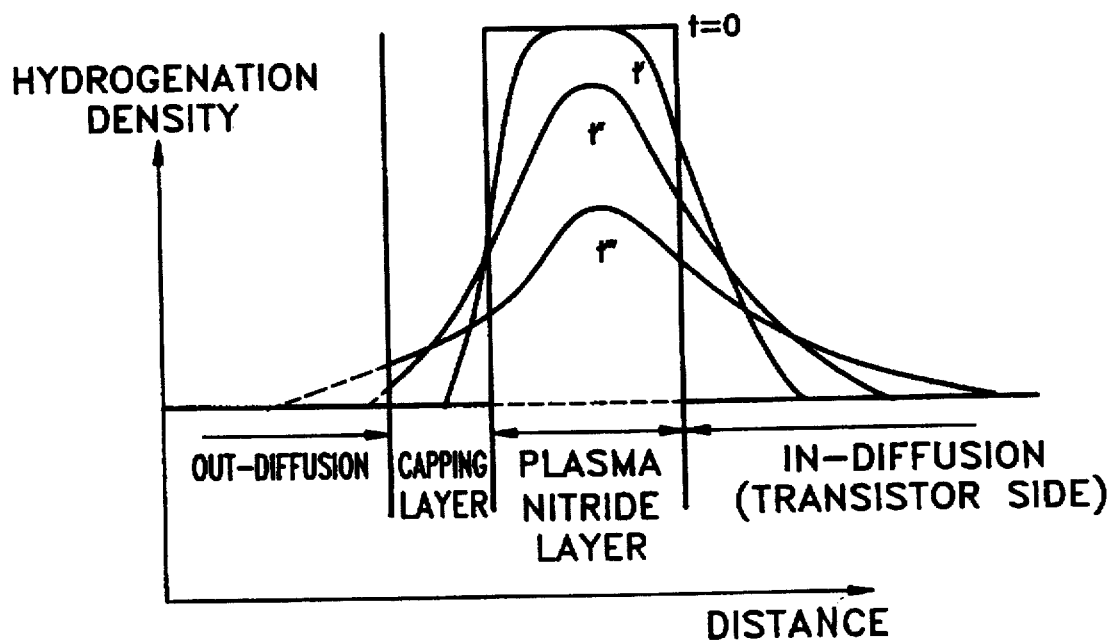
FIG. 6 is a graphical representation illustrating a hydrogen density distribution according to process time, in the present invention using a plasma nitride.
Figure 8:
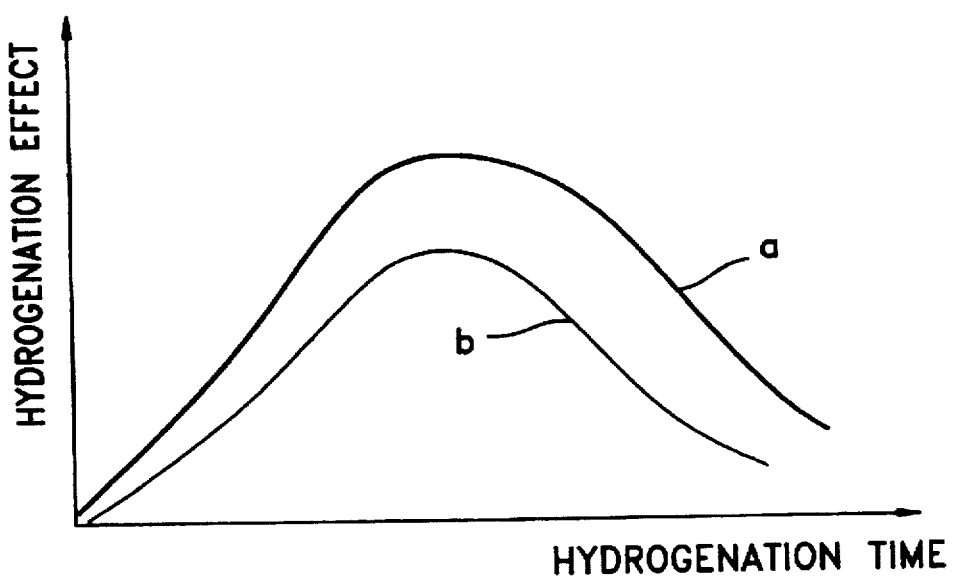
FIG. 8 is a graphical representation for comparing change of a hydrogenation effect according to process time for the case where a capping layer is used and for the case where a capping layer is not used.

The in-diffusion depth of a transistor in a hydrogenation process adopting such plasma nitride can be easily understood by comparing the case without a capping layer in FIG. 5 to the case with a capping layer in FIG. 6. That is, FIGS. 5 and 6 are graphical representations illustrating hydrogen density distribution according to hydrogenation time (t<t'<t#<t'''). In addition, FIG. 8 illustrates a hydrogenation effect with respect to a hydrogenation process time, for cases with (a) and without (b) a capping layer.

Figure 7:
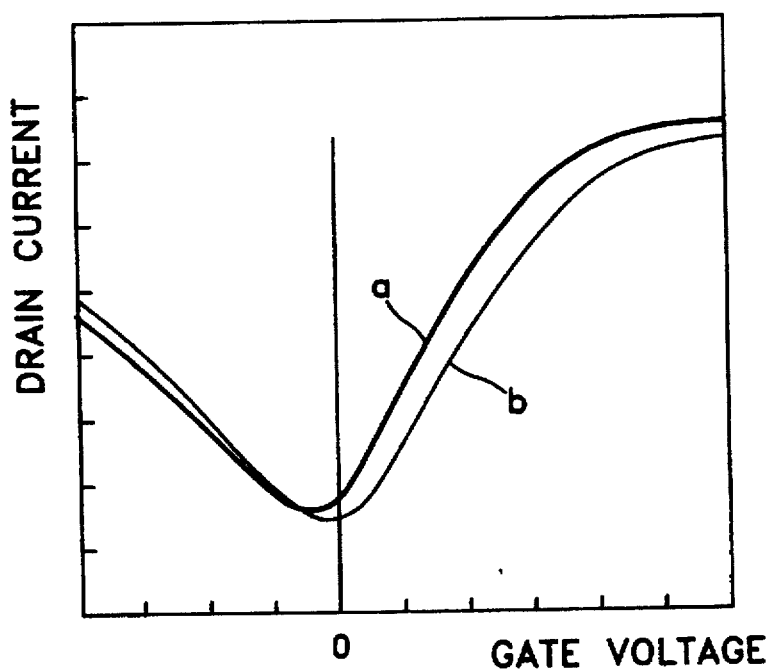
FIG. 7 is a graphical representation for comparing the case where a plasma silicon is employed as a capping layer with the case where a plasma silicon is not employed in a hydrogenation method using a plasma nitride.

When a hydrogenation is performed at 450° C. for thirty minutes on a TFT using a plasma nitride, gate voltage-drain current (Vgs-Ids) characteristics of a TFT with capping layer (a) and a TFT without capping layer (b) are shown in FIG. 7. (Here, Vds=10V.) As shown in FIG. 7, the case with a capping layer results in the better hydrogenation effect. In other words, turn-on current increases and turn-off current decreases. In addition, a sub-threshold slope increases and a threshold voltage is lowered, thereby increasing carrier movement.

What is claimed is:

1. A method of manufacturing a semiconductor device having enhanced hydrogenation effect, comprising the steps of:

forming a transistor structure on a substrate;

forming a plasma nitride layer directly on the transistor structure;

forming a hydrogenated amorphous silicon layer over the plasma nitride layer; and, heating the plasma nitride layer to diffuse hydrogen into the transistor structure.

2. A method of manufacturing a semiconductor device having enhanced hydrogenation effect, comprising the steps of:

forming an oxide buffer layer over a semiconductor substrate;

forming an active layer over the oxide buffer layer;

forming a source region and a drain region in the active layer, the source and drain regions being separated by a channel region;

forming an insulating layer overlaying the active layer;

forming a gate electrode on the insulating layer over the channel region;

forming a source electrode in electrical connection with the source region through the insulating layer;

forming a drain electrode in electrical connection with the drain region through the insulating layer;

forming a plasma nitride layer directly overlaying the insulating layer, the source electrode, and the drain electrode;

forming a plasma amorphous silicon capping layer over the plasma nitride layer; and, heating the plasma nitride layer.

3. A method of manufacturing a semiconductor device having enhanced hydrogenation effect, comprising the steps of:

forming source and drain regions of first conductivity type in a semiconductor substrate of second conductivity type, wherein the source and drain regions being separated by a channel region;

forming an insulating layer overlaying the semiconductor substrate;

forming a gate electrode on the insulating layer over the channel region;

forming a source electrode in electrical connection with the source region through the insulating layer;

forming a drain electrode in electrical connection with the drain region through the insulating layer;

forming a plasma nitride layer directly overlaying the insulating layer, the source electrode, and the drain electrode;

forming a plasma amorphous silicon capping layer over the plasma nitride layer; and, heating the plasma nitride layer.

* * * * *